United States Patent
Cho

(10) Patent No.: US 8,901,963 B2
(45) Date of Patent: Dec. 2, 2014

(54) LEVEL SHIFTING DEVICE AND DISPLAY DEVICE INCLUDING THE SAME

(71) Applicant: Samsung Display Co., Ltd., Gyeonggi-Do (KR)

(72) Inventor: Sang-Jun Cho, Gyeonggi-Do (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 234 days.

(21) Appl. No.: 13/663,919

(22) Filed: Oct. 30, 2012

(65) Prior Publication Data
US 2014/0015818 A1 Jan. 16, 2014

(30) Foreign Application Priority Data
Jul. 12, 2012 (KR) .................. 10-2012-0075876

(51) Int. Cl.
*H03K 19/0175* (2006.01)

(52) U.S. Cl.
USPC .................. 326/62; 326/63; 326/80

(58) Field of Classification Search
None
See application file for complete search history.

(56) References Cited

U.S. PATENT DOCUMENTS

| 7,564,441 | B2 * | 7/2009 | Nakajima et al. | 345/100 |
| 8,686,882 | B2 * | 4/2014 | Seshita | 341/100 |
| 2007/0262976 | A1 | 11/2007 | Matsuda et al. | |
| 2010/0079316 | A1 * | 4/2010 | Okuno et al. | 341/100 |

FOREIGN PATENT DOCUMENTS

| KR | 10-2007-0002370 (A) | 1/2007 |
| KR | 10-2011-0016035 (A) | 2/2011 |

* cited by examiner

*Primary Examiner* — Anh Tran
(74) *Attorney, Agent, or Firm* — Knobbe, Martens, Olson & Bear, LLP

(57) ABSTRACT

A level shifting device is disclosed. The device includes an input unit, a control unit, a high level generating unit, a low level generating unit and an output unit. The input unit generates a level selection signal and a plurality of output selection signals by sampling serial input data. The control unit selectively generates a high level activation signal or a low level activation signal based on the input data, and generates a switching signal based on the input data. The high level generating unit generates a high level output signal in response to the high level activation signal, and the low level generating unit generates a low level output signal in response to the low level activation signal. The output unit outputs one of the high level output signal and the low level output signal to each of a plurality of output signals in response to the switching signal.

20 Claims, 9 Drawing Sheets

LEVEL SHIFTING DEVICE AND DISPLAY DEVICE INCLUDING THE SAME

CROSS-REFERENCE TO RELATED APPLICATIONS

This application claims priority under 35 U.S.C. §119 to Korean patent Application No. 10-2012-0075876 filed on Jul. 12, 2012, the disclosure of which is hereby incorporated by reference herein in its entirety.

BACKGROUND

1. Field

The disclosed technology relates to display devices. More particularly, the disclosed technology relates to level shifting devices included in display devices.

2. Description of the Related Technology

A level shifting device included in a display device may shift up or down signals to desired voltage levels, and may provide the shifted signals to a driving unit and/or a display panel. In a conventional level shifting device, respective signals are applied to different input pins, and may be shifter up or down by different level shifters. Accordingly, the conventional level shifting device has a number of input pins and a number of level shifters, which results in a large size and a high cost of the level shifting device.

SUMMARY OF CERTAIN INVENTIVE ASPECTS

One inventive aspect is a level shifting device, including an input unit configured to sample serial input data including a level selection bit and a plurality of output selection bits and to generate a level selection signal and a plurality of output selection signals based on the input data. The device also includes a control unit configured to selectively generate a high level activation signal or a low level activation signal based on the level selection signal, and configured to generate a switching signal based on the plurality of output selection signals. The device also includes a high level generating unit configured to generate a high level output signal in response to a generated high level activation signal, a low level generating unit configured to generate a low level output signal in response to a generated low level activation signal, and an output unit configured to output one of the high level output signal and the low level output signal on each of a plurality of output signals in response to the switching signal.

Another inventive aspect is a display device, including a display panel including a plurality of pixels, a driving unit configured to drive the display panel to display an image, a timing controller configured to control the driving unit, and configured to generate serial input data including a level selection bit and a plurality of output selection bits, and a level shifting device configured to generate a plurality of output signals having predetermined voltage levels based on the serial input data, and configured to provide the plurality of output signals to the display panel and the driving unit. The level shifting device includes an input unit configured to sample the serial input data including the level selection bit and the plurality of output selection bits and to generate a level selection signal and a plurality of output selection signals based on the input data. The level shifting device also includes a control unit configured to selectively generate a high level activation signal or a low level activation signal based on the level selection signal, and configured to generate a switching signal based on the plurality of output selection signals. The level shifting device also includes a high level generating unit configured to generate a high level output signal in response to a generated high level activation signal, a low level generating unit configured to generate a low level output signal in response to a generated low level activation signal, and an output unit configured to output one of the high level output signal and the low level output signal on each of a plurality of output signals in response to the switching signal.

BRIEF DESCRIPTION OF THE DRAWINGS

Example embodiments can be understood in more detail from the following description taken in conjunction with the accompanying drawings, in which.

DETAILED DESCRIPTION OF CERTAIN INVENTIVE EMBODIMENTS

Figure 1:
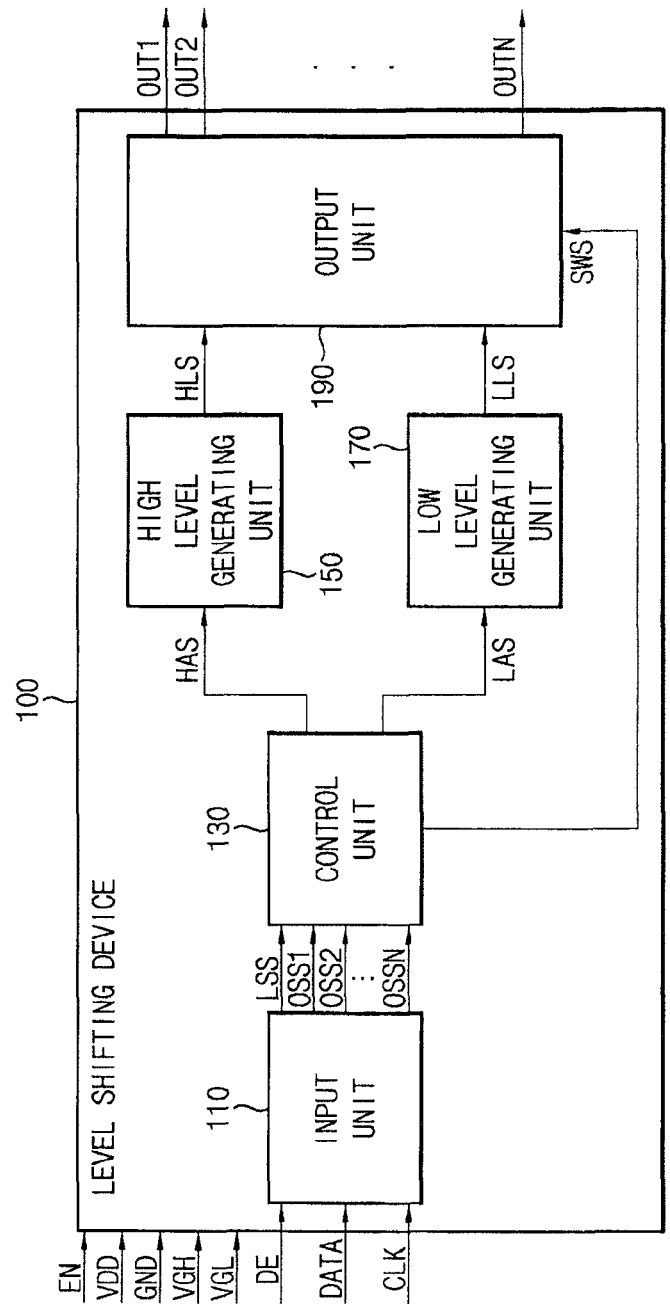
FIG. 1 is a block diagram illustrating a level shifting device in accordance with example embodiments.

The example embodiments are described more fully hereinafter with reference to the accompanying drawings. The inventive concepts and aspects may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals generally refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a level shifting device in accordance with example embodiments.

Referring to FIG. 1, a level shifting device 100 of a display device includes an input unit 110, a control unit 130, a high level generating unit 150, a low level generating unit 170 and an output unit 190. The level shifting device 100 may receive an enable signal EN, a power supply voltage VDD, a ground voltage GND, a high gate voltage VGH and a low gate voltage VGL. The level shifting device 100 may be supplied with power by the power supply voltage VDD and the ground voltage GND, and may operate in response to the enable signal EN. The level shifting device 100 may generate a plurality of output signals OUT1, OUT2 and OUTN having predetermined voltage levels based on the high gate voltage VGH and the low gate voltage VGL.

The input unit 110 may generate a level selection signal LSS and a plurality of output selection signals OSS1, OSS2 and OSSN by sampling serial input data DATA in response to a clock signal CLK while a data enable signal DE is active. The serial input data DATA may include a level selection bit and a plurality of output selection bits. The plurality of output selection bits may include information indicating, among the plurality of output signals OUT1, OUT2 and OUTN, a selected output signal of which a voltage level transitions. For example, to represent the selected output signal, one bit corresponding to the selected output signal may have data "1", and other bits of the plurality of output selection bits may have data "0". In this case, an output selection signal corresponding to the selected output signal among the plurality of output selection signals OSS1, OSS2 and OSSN may have a logic high level, and other output selection signals of the plurality of output selection signals OSS1, OSS2 and OSSN may have a logic low level. The level selection bit may include information indicating whether the selected output signal transitions to a high level or a low level. For example, the level selection bit may have data "1" when the selected output signal transitions from a low voltage level to a high voltage level, and may have data "0" when the selected output signal transitions from a high voltage level to a low voltage level. The input unit 110 may generate the level selection signal LSS having a logic high level when the selected output signal transitions to the high voltage level, and may generate the level selection signal LSS having a logic low level when the selected output signal transitions to the low voltage level.

The control unit 130 may control the high level generating unit 150, the low level generating unit 170 and the output unit 190 based on the level selection signal LSS and the plurality of output selection signals OSS1, OSS2 and OSSN generated by the input unit 110. The control unit 130 may selectively generate a high level activation signal HAS or a low level activation signal LAS based on the level selection signal LSS. For example, the control unit 130 may generate the high level activation signal HAS when the level selection signal LSS has the logic high level, and may generate the low level activation signal LAS when the level selection signal LSS has the logic low level. Further, the control unit 130 may generate a switching signal SWS based on the plurality of output selection signals OSS1, OSS2 and OSSN. For example, in a case where a first output selection signal OSS1 has a logic high level, the control unit 130 may generate the switching signal SWS such that a first output signal OUT1 transitions.

The high level generating unit 150 may generate a high level output signal HLS in response to the high level activation signal HAS, and the low level generating unit 170 may generate a low level output signal LLS in response to the low level activation signal LAS. In some example embodiments, the high level generating unit 150 may include a high level shifter that generates the high level output signal HLS by stepping up a first input signal based on the high gate voltage VGH, and the low level generating unit 170 may include a low level shifter that generates the low level output signal LLS by stepping up a second input signal based on the low gate voltage VGL. For example, the first input signal may be the power supply voltage VDD, and the high level output signal HLS may have a voltage level substantially the same as a voltage level of the high gate voltage VGH. The second input signal may be the ground voltage GND, and the low level output signal LLS may have a voltage level substantially the same as a voltage level of the low gate voltage VGL.

The output unit 190 may output one of the high level output signal HLS and the low level output signal LLS as the selected output signal that is selected from the plurality of output signals OUT1, OUT2 and OUTN in response to the switching signal SWS. For example, in a case where the level selection signal LSS has the logic high level, and the first output selection signal OSS1 has the logic high level, the control unit 130 may generate the switching signal SWS to connect the high level generating unit 150 to an output terminal outputting the first output signal OUT1, and the output unit 190 may output the high level output signal HLS as the first output signal OUT1.

A conventional level shifting device receives a plurality of input signals respectively corresponding to a plurality of output signals at different input pins. Accordingly, the number of signal input pins included in the conventional level shifting device corresponds to the number of the plurality of output signals. For example, in a case where the conventional level shifting device outputs eight output signals, the conventional level shifting device requires eight signal input pins. However, the level shifting device 100 according to example embodiments may require four signal input pins for respectively receiving the enable signal EN, the data enable signal DE, the serial input data DATA and the clock signal CLK regardless of the number of the plurality of output signals OUT1, . . . , OUTN, thereby reducing the number of signal input pins.

Further, the conventional level shifting device performs step-up or step-down operations for respective output signals by using different level shifters. Accordingly, the number of the level shifters included in the conventional level shifting device corresponds to the number of the plurality of output signals. For example, in a case where the conventional level shifting device outputs eight output signals, the conventional level shifting device requires eight level shifters. However, the level shifting device 100 according to example embodiments may share the high level generating unit 150 and the low level generating unit 170 with respect to the plurality of output signals OSS1, OSS2 and OSSN, and thus the level shifting device 100 may include two level shifters respectively included in the high level generating unit 150 and the low level generating unit 170. Accordingly, the level shifting device 100 according to example embodiments may have a small size.

Figure 2:
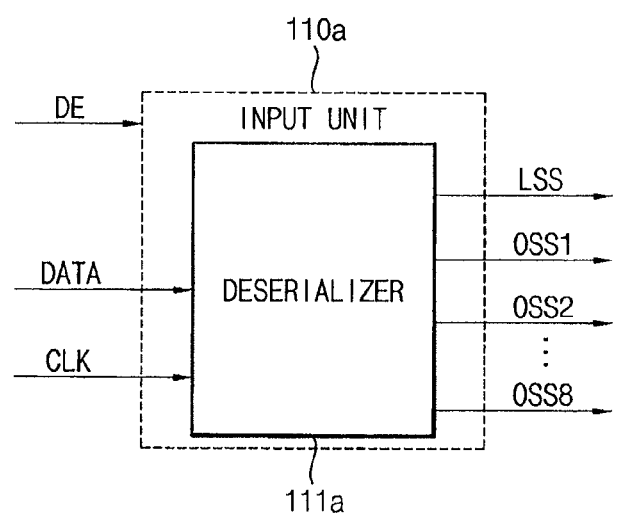
FIG. 2 is a diagram illustrating an example of an input unit included in a level shifting device of FIG. 1 in accordance with example embodiments.
Figure 3:
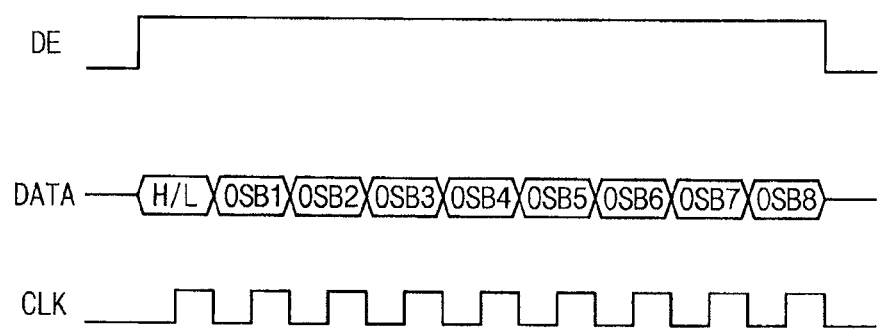
FIG. 3 is a diagram illustrating an example of serial input data applied to an input unit of FIG. 2 in accordance with example embodiments.

FIG. 2 is a diagram illustrating an example of an input unit included in a level shifting device of FIG. 1 in accordance with example embodiments, and FIG. 3 is a diagram illustrating an example of serial input data applied to an input unit of FIG. 2 in accordance with example embodiments.

Referring to FIGS. 2 and 3, an input unit 110a may include a deserializer 111a. While a data enable signal DE is active, the input unit 110a may perform a sampling operation that samples serial input data DATA in response to a clock signal CLK.

The deserializer 111a may receive the serial input data DATA and the clock signal CLK. The serial input data DATA may include a level selection bit H/L and a plurality of output selection bits OSB1, OSB2, OSB3, OSB4, OSB5, OSB6, OSB7 and OSB8. The level selection bit H/L may include information indicating whether a selected output signal transitions to a high level or a low level. The plurality of output selection bits OSB1, OSB2, OSB3, OSB4, OSB5, OSB6, OSB7 and OSB8 may include information indicating the selected output signal among a plurality of output signals.

The deserializer 111a may generate a level selection signal LSS and a plurality of output selection signals OSS1, OSS2 and OSS8. For example, the deserializer 111a may generate the level selection signal LSS by sampling the level selection bit H/L at a first rising edge of the clock signal CLK, and may generate first through eighth output selection signals OSS1, OSS2 and OSS8 by sampling first through eighth output selection bits OSB1, OSB2, OSB3, OSB4, OSB5, OSB6, OSB7 and OSB8 at second through ninth rising edges of the clock signal CLK. In some example embodiments, the level selection signal LSS output from the deserializer 111a may have a logic high level in a case where the selected output signal transitions to a high level, and may have a logic low level in a case where the selected output signal transitions to a low level. Further, among the first through eighth output selection signals OSS1, OSS2 and OSS8 output from the deserializer 111a, an output selection signal corresponding to the selected output signal may have a logic high level, and other output selection signals may have a logic low level.

The input unit 110a may provide the level selection signal LSS and the plurality of output selection signals OSS1, OSS2 and OSS8 to a control unit 130 illustrated in FIG. 1. The control unit 130 illustrated in FIG. 1 may selectively generate a high level activation signal or a low level activation signal in response to the level selection signal LSS. For example, the control unit 130 illustrated in FIG. 1 may generate the high level activation signal to activate a high level generating unit 150 illustrated in FIG. 1 in a case where the level selection signal LSS has the logic high level, and may generate the low level activation signal to activate a low level generating unit 170 illustrated in FIG. 1 in a case where the level selection signal LSS has the logic low level. Further, the control unit 130 illustrated in FIG. 1 may generate a switching signal to output a high level output signal generated by the high level generating unit 150 illustrated in FIG. 1 or a low level output signal generated by the low level generating unit 170 illustrated in FIG. 1 as the selected output signal corresponding to the output selection signal having the logic high level.

Although FIGS. 2 and 3 illustrate an example where a level shifting device has eight output signals, the level shifting device according to example embodiments may have any number of output signals.

Figure 4:
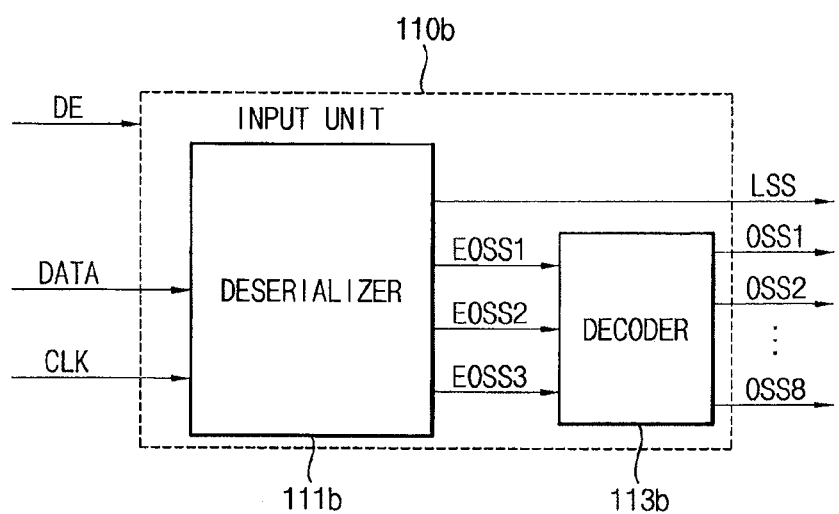
FIG. 4 is a diagram illustrating another example of an input unit included in a level shifting device of FIG. 1 in accordance with example embodiments.
Figure 5:
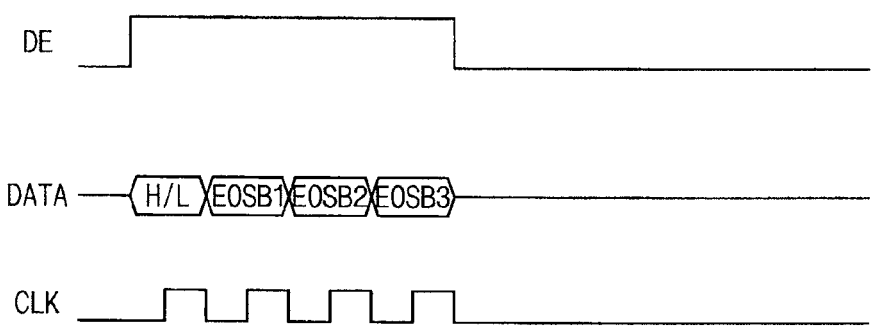
FIG. 5 is a diagram illustrating an example of serial input data applied to an input unit of FIG. 4 in accordance with example embodiments.

FIG. 4 is a diagram illustrating another example of an input unit included in a level shifting device of FIG. 1 in accordance with example embodiments, and FIG. 5 is a diagram illustrating an example of serial input data applied to an input unit of FIG. 4 in accordance with example embodiments.

Referring to FIGS. 4 and 5, an input unit 110b may include a deserializer 111b and a decoder 113b.

The deserializer 111b may receive serial input data DATA and a clock signal CLK. The serial input data DATA may include a level selection bit H/L and a plurality of output selection bits EOSB1, EOSB2 and EOSB3. The plurality of output selection bits EOSB1, EOSB2 and EOSB3 may include information indicating a selected output signal among a plurality of output signals. The plurality of output selection bits EOSB1, EOSB2 and EOSB3 may be encoded bits that are encoded as a binary code. For example, first through third output selection bits EOSB1, EOSB2 and EOSB3 may have a value of "000" to indicate that a first output signal is selected, may have a value of "111" to indicate that an eighth output signal is selected. The deserializer 111b may generate a level selection signal LSS and a plurality of encoded output selection signals EOSS1, EOSS2 and EOSS3 by deserializing the serial input data DATA in response to the clock signal CLK.

The decoder 113b may generate a plurality of output selection signals OSS1, OSS2 and OSS8 by decoding the plurality of encoded output selection signals EOSS1, EOSS2 and EOSS3. For example, among first through eighth output selection signals OSS1, OSS2 and OSS8 output from the decoder 113b, an output selection signal corresponding to a selected output signal may have a logic high level, and other output selection signals may have a logic low level.

The input unit 110b may provide the level selection signal LSS and the plurality of output selection signals OSS1, OSS2 and OSS8 to a control unit 130 illustrated in FIG. 1. Based on the level selection signal LSS and the plurality of output selection signals OSS1, OSS2 and OSS8, the control unit 130 illustrated in FIG. 1 may selectively generate a high level activation signal or a low level activation signal, and may generate a switching signal.

Figure 6:
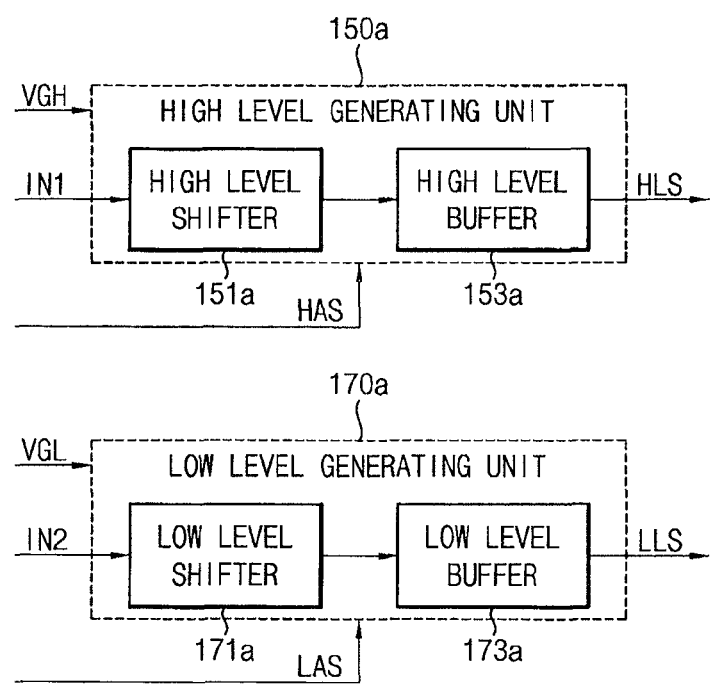
FIG. 6 is a diagram illustrating an example of a high level generating unit and a low level generating unit included in a level shifting device of FIG. 1 in accordance with example embodiments.

FIG. 6 is a diagram illustrating an example of a high level generating unit and a low level generating unit included in a level shifting device of FIG. 1 in accordance with example embodiments.

Referring to FIG. 6, a high level generating unit 150a may generate a high level output signal HLS in response to a high level activation signal HAS, and a low level generating unit 170a may generate a low level output signal LLS in response to a low level activation signal LAS. The high level generating unit 150a may use a high gate voltage VGH to generate the high level output signal HLS having a voltage level substantially the same as a voltage level of the high gate voltage VGH, and the low level generating unit 170a may use a low gate voltage VGL to generate the low level output signal LLS having a voltage level substantially the same as a voltage level of the low gate voltage VGL.

The high level generating unit 150a may include a high level shifter 151a that generates the high level output signal HLS by stepping up a first input signal IN1 to the high gate voltage VGH, and the low level generating unit 170a may include a low level shifter 171a that generates the low level output signal LLS by stepping down a second input signal IN2 to the low gate voltage VGL. In some example embodiments, the high level shifter 151a may step up a power supply voltage VDD as the first input signal IN1 to generate the high level output signal HLS having a voltage level substantially the same as a voltage level of the high gate voltage VGH, and the low level shifter 171a may step down a ground voltage GND as the second input signal IN2 to generate the low level output signal LLS having a voltage level substantially the same as a voltage level of the low gate voltage VGL. For example, the high level shifter 151a may generate the high level output signal HLS of about 15 V by stepping up the power supply voltage VDD of about 1.8 V, and the low level shifter 171a may generate the low level output signal LLS of about −5 V by stepping down the ground voltage GND of about 0 V. A conventional level shifting device includes one level shifter per output signal. However, a level shifting device according to example embodiments may generate all output signals by using only the high level shifter 151a and the low level shifter 171a. Accordingly, the level shifting device according to example embodiments may include the reduced number of level shifters 151a and 171a, and may have a small size.

The high level generating unit 150a may further include a high level buffer 153a for buffering the high level output signal HLS generated by the high level shifter 151a, and the low level generating unit 170a may further include a low level buffer 173a for buffering the low level output signal LLS generated by the low level shifter 171a. In some example embodiments, the high level buffer 153a may pull up an output terminal of the level shifting device to a high level, and the low level buffer 173a may pull down the output terminal of the level shifting device to a low level. Accordingly, the selected output signal output from the output terminal of the level shifting device may rapidly transition to the high level or the low level.

Figure 7:
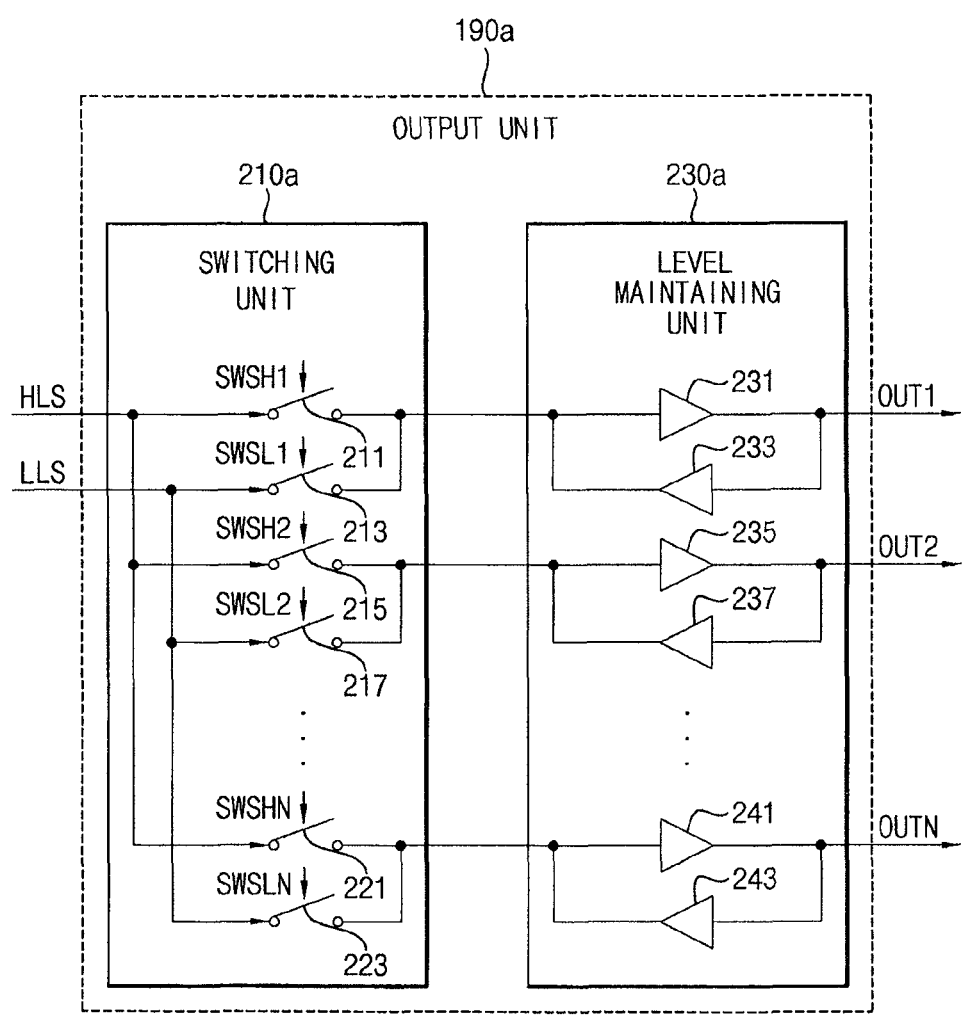
FIG. 7 is a diagram illustrating an example of an output unit included in a level shifting device of FIG. 1 in accordance with example embodiments.

FIG. 7 is a diagram illustrating an example of an output unit included in a level shifting device of FIG. 1 in accordance with example embodiments.

Referring to FIG. 7, an output unit 190a includes a switching unit 210a and a level maintaining unit 230a.

The switching unit 210a may connect one of an output terminal of a high level generating unit 150 illustrated in FIG. 1 or an output terminal of a low level generating unit 170 illustrated in FIG. 1 to an input terminal that is selected from a plurality of input terminals of the level maintaining unit 230a in response to a switching signal provided from a control unit 130 illustrated in FIG. 1.

In some example embodiments, the switching signal provided from the control unit 130 illustrated in FIG. 1 may include a plurality of high level selection switching signals SWSH1, SWSH2 and SWSHN and a plurality of low level selection switching signals SWSL1, SWSL2 and SWSLN, and the switching unit 210a may include a plurality of first switching elements 211, 215 and 221 that are turned on or off in response to the plurality of high level selection switching signals SWSH1, SWSH2 and SWSHN, and a plurality of second switching elements 213, 217 and 223 that are turned on or off in response to the plurality of low level selection switching signals SWSL1, SWSL2 and SWSLN. The plurality of first switching elements 211, 215 and 221 may selectively connect the output terminal of the high level generating unit 150 illustrated in FIG. 1 to the plurality of input terminals of the level maintaining unit 230a in response to the plurality of high level selection switching signals SWSH1, SWSH2 and SWSHN, and the plurality of second switching elements 213, 217 and 223 may selectively connect the output terminal of the low level generating unit 170 illustrated in FIG. 1 to the plurality of input terminals of the level maintaining unit 230a in response to the plurality of low level selection switching signals SWSL1, SWSL2 and SWSLN. One of the plurality of high level selection switching signals SWSH1, SWSH2 and SWSHN and the plurality of low level selection switching signals SWSL1, SWSL2 and SWSLN generated by the control unit 130 illustrated in FIG. 1 may have a logic high level so that a corresponding one of the plurality of first switching elements 211, 215 and 221 and the plurality of second switching elements 213, 217 and 223 is turned on.

For example, in a case where a first output signal OUT1 among a plurality of output signals OUT1, OUT2 and OUTN transitions from a low level to a high level, the control unit 130 illustrated in FIG. 1 may activate the high level generating unit 150 illustrated in FIG. 1 to generate a high level output signal HLS, and may generate a first high level selection switching signal SWSH1 having the logic high level. A switching element 211 receiving the first high level selection switching signal SWSH1 may be turned on in response to the first high level selection switching signal SWSH1 having the logic high level, other switching elements 213, 215, 217, 221 and 223 may be turned off. Accordingly, the high level output signal HLS may be applied to an input terminal corresponding to the first output signal OUT1 among the plurality of input terminals of the level maintaining unit 230a through the switching element 211 receiving the first high level selection switching signal SWSH1, and no signal may be applied to other input terminals.

In a case where a second output signal OUT2 among the plurality of output signals OUT1, OUT2 and OUTN transitions from a high level to a low level, the control unit 130 illustrated in FIG. 1 may activate the low level generating unit 170 illustrated in FIG. 1 to generate a low level output signal LLS, and may generate a second low level selection switching signal SWSL2 having the logic high level. A switching element 217 receiving the second low level selection switching signal SWSL2 may be turned on in response to the second low level selection switching signal SWSL2 having the logic high level, other switching elements 211, 213, 215, 221 and 223 may be turned off. Accordingly, the low level output signal LLS may be applied to an input terminal corresponding to the second output signal OUT2 among the plurality of input terminals of the level maintaining unit 230a through the switching element 217 receiving the second low level selection switching signal SWSL2, and no signal may be applied to other input terminals.

The level maintaining unit 230a may change a voltage level of a selected output signal corresponding to an input terminal receiving the high level output signal HLS or the low level output signal LLS to a voltage level of the high level output signal HLS or a voltage level of the low level output signal LLS, and may maintain voltage levels of unselected output signals as previous voltage levels of the unselected output signals. For example, in a case where the high level output signal HLS is applied to an input terminal corresponding to the first output signal OUT1 among the plurality of input terminals of the level maintaining unit 230a, the level maintaining unit 230a may change a voltage level of the first output signal OUT1 to the voltage level of the high level output signal HLS, and may maintain voltage levels of second through N-th output signals OUT2 and OUTN as previous voltage levels.

In some example embodiments, the level maintaining unit 230a may include a plurality of latches for maintaining voltage levels of the plurality of output signals OUT1, OUT2 and OUTN. Each latch may include two buffers 231, 233, 235, 237, 241 and 243. An input terminal of one buffer included in the latch may be coupled to an output terminal of the other buffer included in the latch, and an input terminal of the other buffer included in the latch may be coupled to an output terminal of the one buffer included in the latch. The high level output signal HLS or the low level output signal LLS may be applied to one latch of the plurality of latches, and thus the one latch may output an output signal having a voltage level substantially the same as the voltage level of the high level output signal HLS or the voltage level of the low level output signal LLS. Other latches to which neither the high and low level output signals HLS and LLS are not applied may maintain voltage levels of corresponding output signals.

Figure 8:
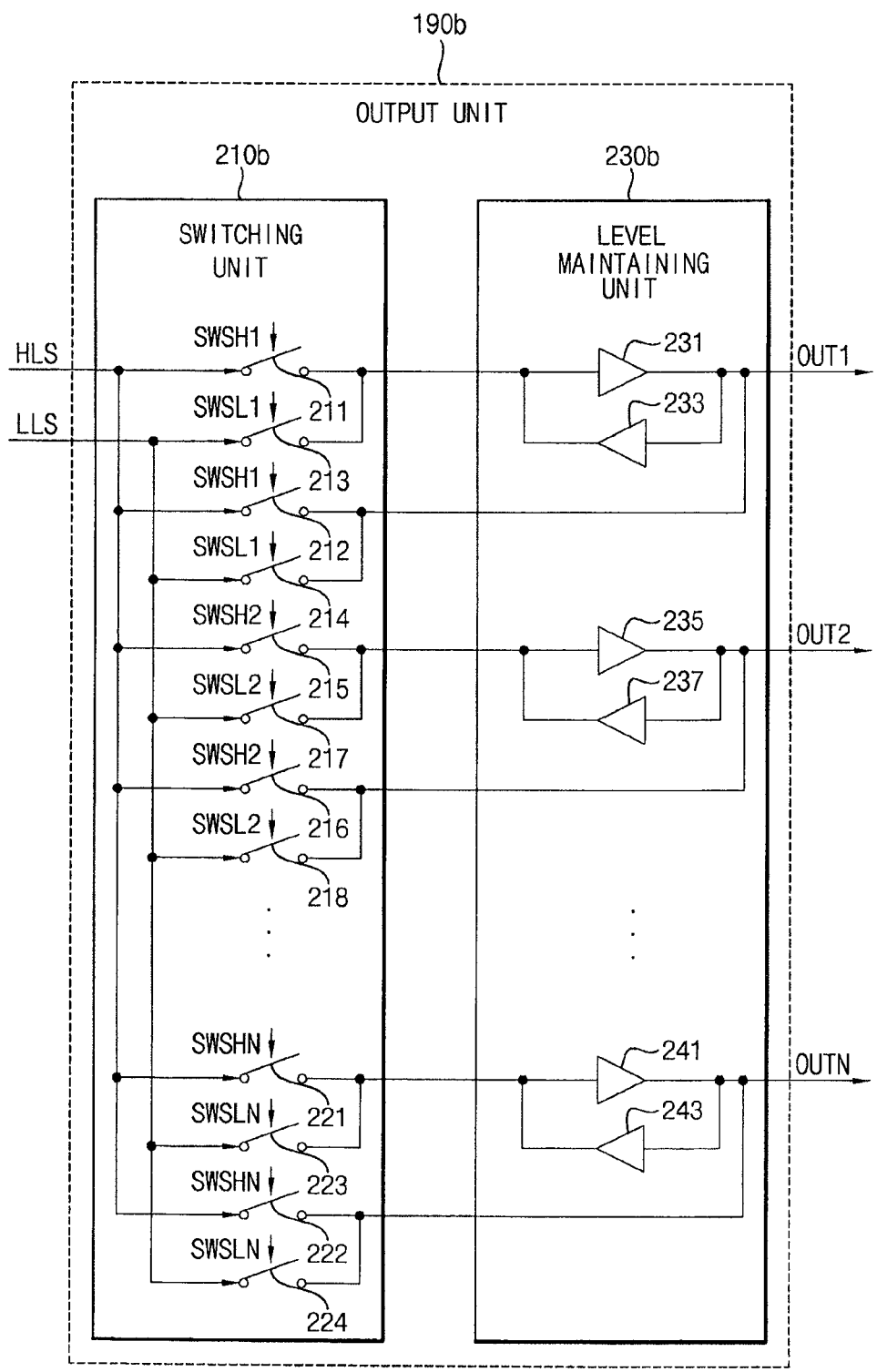
FIG. 8 is a diagram illustrating another example of an output unit included in a level shifting device of FIG. 1 in accordance with example embodiments.

FIG. 8 is a diagram illustrating another example of an output unit included in a level shifting device of FIG. 1 in accordance with example embodiments.

Referring to FIG. 8, an output unit 190b includes a switching unit 210b and a level maintaining unit 230b.

The switching unit 210b may connect one of an output terminal of a high level generating unit 150 illustrated in FIG. 1 or an output terminal of a low level generating unit 170 illustrated in FIG. 1 to an input terminal that is selected from a plurality of input terminals of the level maintaining unit 230b and an output terminal that that is selected from a plurality of output terminals of the level maintaining unit 230b in response to a switching signal provided from a control unit 130 illustrated in FIG. 1. Since the switching unit 210b connects the high level generating unit 150 or the low level generating unit 170 not only to the selected input terminal but also to the selected output terminal of the level maintaining unit 230b, the high level generating unit 150 or the low level generating unit 170 may pull up or down the selected output terminal, and thus a selected output signal output from the selected output terminal may rapidly transition to a desired voltage level.

The switching unit 210b may include a plurality of first switching elements 211, 215 and 221 that are turned on or off in response to a plurality of high level selection switching signals SWSH1, SWSH2 and SWSHN, a plurality of second switching elements 213, 217 and 223 that are turned on or off in response to a plurality of low level selection switching signals SWSL1, SWSL2 and SWSLN, a plurality of third switching elements 212, 216 and 222 that are turned on or off in response to the plurality of high level selection switching signals SWSH1, SWSH2 and SWSHN, and a plurality of fourth switching elements 214, 218 and 224 that are turned on or off in response to the plurality of low level selection switching signals SWSL1, SWSL2 and SWSLN. The plurality of third switching elements 212, 216 and 222 may selectively connect the output terminal of the high level generating unit 150 illustrated in FIG. 1 to the plurality of output terminals of the level maintaining unit 230b in response to the plurality of high level selection switching signals SWSH1, SWSH2 and SWSHN, and the plurality of fourth switching elements 214, 218 and 224 may selectively connect the output terminal of the low level generating unit 170 illustrated in FIG. 1 to the plurality of output terminals of the level maintaining unit 230b in response to the plurality of low level selection switching signals SWSL1, SWSL2 and SWSLN. One of the plurality of high level selection switching signals SWSH1, SWSH2 and SWSHN and the plurality of low level selection switching signals SWSL1, SWSL2 and SWSLN generated by the control unit 130 illustrated in FIG. 1 may have a logic high level so that a corresponding one of the plurality of first switching elements 211, 215 and 221 and the plurality of second switching elements 213, 217 and 223 is turned on and a corresponding one of the plurality of third switching elements 212, 216 and 222 and the plurality of fourth switching elements 214, 218 and 224 is turned on.

For example, in a case where a first output signal OUT1 among a plurality of output signals OUT1, OUT2 and OUTN transitions from a low level to a high level, the control unit 130 illustrated in FIG. 1 may activate the high level generating unit 150 illustrated in FIG. 1 to generate a high level output signal HLS, and may generate a first high level selection switching signal SWSH1 having the logic high level. A switching element 211 receiving the first high level selection switching signal SWSH1 among the plurality of first switching elements 211, 215 and 221 and a switching element 212 receiving the first high level selection switching signal SWSH1 among the plurality of third switching elements 212, 216 and 222 may be turned on in response to the first high level selection switching signal SWSH1 having the logic high level, other switching elements 213, 214, 215, 216, 217, 218, 221, 222, 223 and 224 may be turned off. Accordingly, the high level output signal HLS may be applied to an input terminal corresponding to the first output signal OUT1 among the plurality of input terminals of the level maintaining unit 230b through the switching element 211 receiving the first high level selection switching signal SWSH1, and no signal is applied to other input terminals. Further, the high level generating unit 150 illustrated in FIG. 1 may be coupled to an output terminal corresponding to the first output signal OUT1 among the plurality of output terminals of the level maintaining unit 230b through the switching element 212 receiving the first high level selection switching signal SWSH1, and thus the high level generating unit 150 illustrated in FIG. 1 may pull up the output terminal corresponding to the first output signal OUT1.

In a case where a second output signal OUT2 among the plurality of output signals OUT1, OUT2 and OUTN transitions from a high level to a low level, the control unit 130 illustrated in FIG. 1 may activate the low level generating unit 170 illustrated in FIG. 1 to generate a low level output signal LLS, and may generate a second low level selection switching signal SWSL2 having the logic high level. A switching element 217 receiving the second low level selection switching signal SWSL2 among the plurality of second switching elements 213, 217 and 223 and a switching element 218 receiving the second low level selection switching signal SWSL2 among the plurality of fourth switching elements 214, 218 and 224 may be turned on in response to the second low level selection switching signal SWSL2 having the logic high level, other switching elements 211, 212, 213, 214, 215, 216, 221, 222, 223 and 224 may be turned off. Accordingly, the low level output signal LLS may be applied to an input terminal corresponding to the second output signal OUT2 among the plurality of input terminals of the level maintaining unit 230b through the switching element 217 receiving the second low level selection switching signal SWSL2, and no signal may be applied to other input terminals. Further, the low level generating unit 170 illustrated in FIG. 1 may be coupled to an output terminal corresponding to the second output signal OUT2 among the plurality of output terminals of the level maintaining unit 230b through the switching element 218 receiving the second low level selection switching signal SWSL2, and thus the low level generating unit 170 illustrated in FIG. 1 may pull down the output terminal corresponding to the second output signal OUT2.

The level maintaining unit 230b may change a voltage level of a selected output signal corresponding to an input terminal receiving the high level output signal HLS or the low level output signal LLS to a voltage level of the high level output signal HLS or a voltage level of the low level output signal LLS, and may maintain voltage levels of unselected output signals as previous voltage levels of the unselected output signals. The level maintaining unit 230b may include a plurality of latches for maintaining voltage levels of the plurality of output signals OUT1, OUT2 and OUTN.

Figure 9:
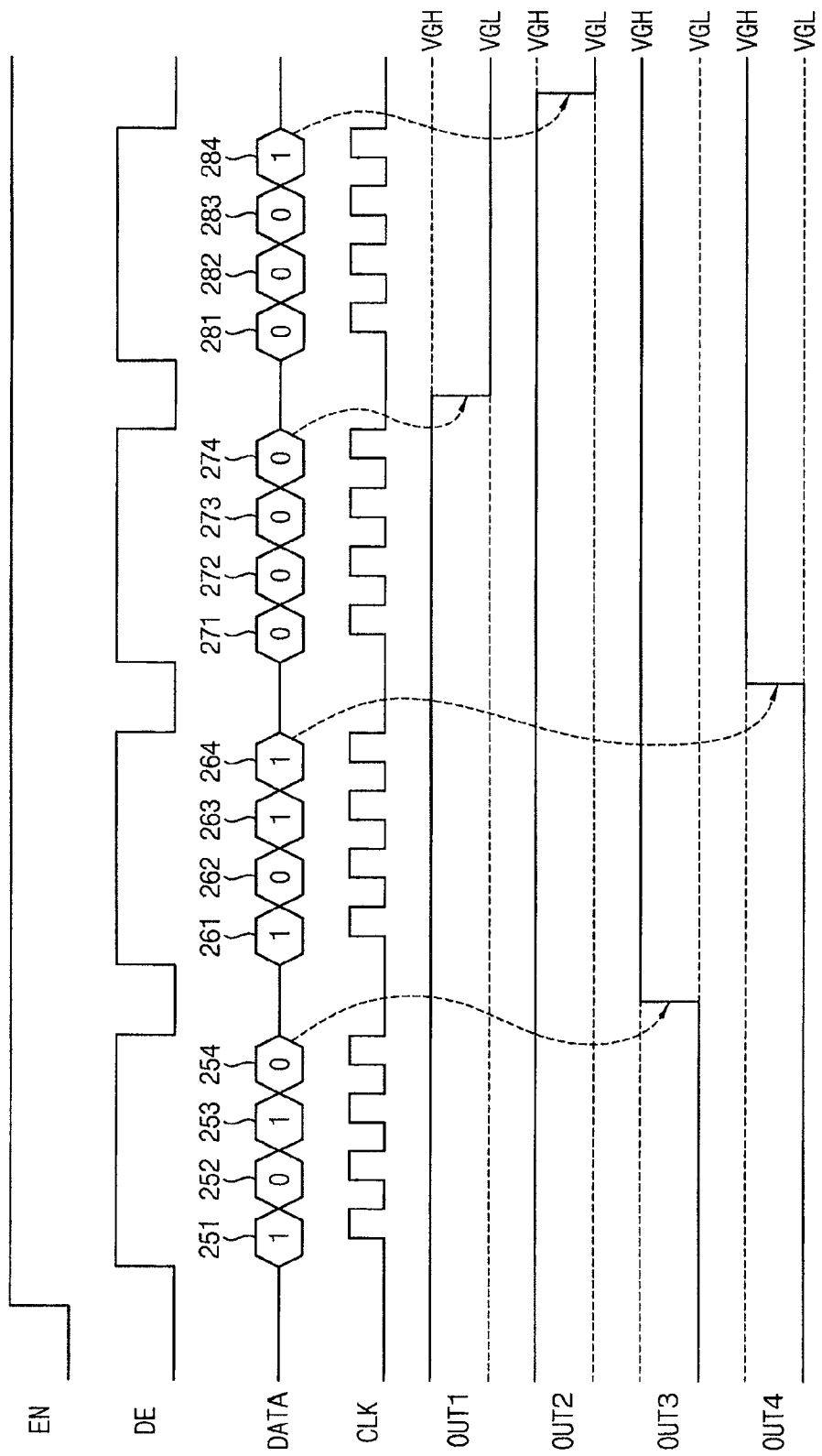
FIG. 9 is a timing diagram for describing an operation of a level shifting device of FIG. 1 in accordance with example embodiments.

FIG. 9 is a timing diagram for describing an operation of a level shifting device of FIG. 1 in accordance with example embodiments.

Referring to FIGS. 1 and 9, a level shifting device 100 may generate a plurality of output signals OUT1, OUT2, OUT3, OUT4 and OUTN having desired voltage levels while an enable signal EN is active. The level shifting device 100 may cause a selected output signal indicated by a plurality of output selection bits included in serial input data DATA to transition to a voltage level indicated by a level selection bit included in the serial input data DATA.

For example, in a case where a level selection bit 251 of the serial input data DATA has a value of "1" and a plurality of output selection bits 252, 253 and 254 of the serial input data DATA have a value of "010", an input unit 110 may generate a level selection signal LSS having a logic high level and a third output selection signal having a logic high level by sampling the serial input data DATA in response to a clock signal CLK. A control unit 130 may generate a high level activation signal HAS in response to the level selection signal LSS having the logic high level. A high level generating unit 150 may generate a high level output signal HLS in response to the high level activation signal HAS. Further, the control unit 130 may generate a switching signal SWS in response to the third output selection signal having the logic high level, and the output unit 190 may output the high level output signal HLS as a third output signal OUT3 in response to the switching signal SWS. Accordingly, the third output signal OUT3 may transition from a low level to a high level.

In a case where a level selection bit 261 of the serial input data DATA has a value of "1" and a plurality of output selection bits 262, 263 and 264 of the serial input data DATA have a value of "011", the input unit 110 may generate a level selection signal LSS having a logic high level and a fourth output selection signal having a logic high level by sampling the serial input data DATA in response to the clock signal CLK. The control unit 130 may generate a high level activation signal HAS in response to the level selection signal LSS having the logic high level. The high level generating unit 150 may generate a high level output signal HLS in response to the high level activation signal HAS. Further, the control unit 130 may generate a switching signal SWS in response to the fourth output selection signal having the logic high level, and the output unit 190 may output the high level output signal HLS as a fourth output signal OUT4 in response to the switching signal SWS. Accordingly, the fourth output signal OUT4 may transition from a low level to a high level.

In a case where a level selection bit 271 of the serial input data DATA has a value of "0" and a plurality of output selection bits 272, 273 and 274 of the serial input data DATA have a value of "000", the input unit 110 may generate a level selection signal LSS having a logic low level and a first output selection signal OSS1 having a logic high level by sampling the serial input data DATA in response to the clock signal CLK. The control unit 130 may generate a low level activation signal LAS in response to the level selection signal LSS having the logic low level. The low level generating unit 170 may generate a low level output signal LLS in response to the low level activation signal LAS. Further, the control unit 130 may generate a switching signal SWS in response to the first output selection signal OSS1 having the logic high level, and the output unit 190 may output the low level output signal LLS as a first output signal OUT1 in response to the switching signal SWS. Accordingly, the first output signal OUT1 may transition from a high level to a low level.

In a case where a level selection bit 281 of the serial input data DATA has a value of "0" and a plurality of output selection bits 282, 283 and 284 of the serial input data DATA have a value of "001", the input unit 110 may generate a level selection signal LSS having a logic low level and a second output selection signal OSS2 having a logic high level by sampling the serial input data DATA in response to the clock signal CLK. The control unit 130 may generate a low level activation signal LAS in response to the level selection signal LSS having the logic low level. The low level generating unit 170 may generate a low level output signal LLS in response to the low level activation signal LAS. Further, the control unit 130 may generate a switching signal SWS in response to the second output selection signal OSS2 having the logic high level, and the output unit 190 may output the low level output signal LLS as a second output signal OUT2 in response to the switching signal SWS. Accordingly, the second output signal OUT2 may transition from a high level to a low level.

As described above, since the level shifting device 100 receives the serial input data DATA, the level shifting device 100 according to example embodiments may have the reduced number of signal input pins. Further, since the high level generating unit 150 and the low level generating unit 170 are shared with respect to the plurality of output signals OUT1, OUT2, OUT3, OUT4 and OUT5, the level shifting device 100 according to example embodiments may include the reduced number of level shifters, and may have a small size.

Figure 10:
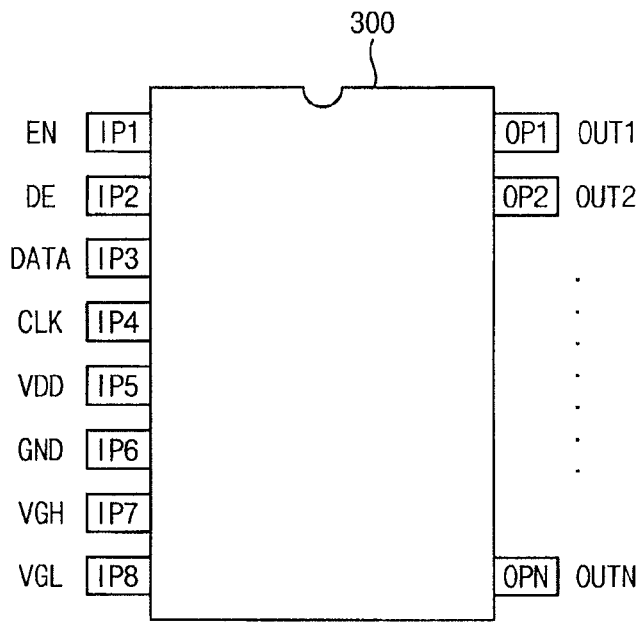
FIG. 10 is a block diagram illustrating an example of a level shifting device in accordance with example embodiments.

FIG. 10 is a block diagram illustrating an example of a level shifting device in accordance with example embodiments.

Referring to FIG. 10, a level shifting device 300 may be packaged into an integrated circuit, and may be mounted in a display device. The level shifting device 300 may have a plurality of input pins IP1, IP2, IP3, IP4, IP5, IP6, IP7 and IP8 and a plurality of output pins OP1, OP2 and OPN.

The plurality of input pins IP1, IP2, IP3, IP4, IP5, IP6, IP7 and IP8 may include signal input pins IP1, IP2, IP3 and IP4 for receiving signals and power input pins IP5, IP6, IP7 and IP8 for receiving power supply voltages. For example, an enable signal EN may be applied to a first signal input pin IP1, a data enable signal DE may be applied to a second signal input pin IP2, serial input data DATA may be applied to a third signal input pin IP3 and a clock signal CLK may be applied to a fourth signal input pin IP4. Further, a power supply voltage VDD may be applied to a first power input pin IP5, a ground voltage GND may be applied to a second power input pin IP6, a high gate voltage VGH may be applied to a third power input pin IP7 and a low gate voltage VGL may be applied to a fourth power input pin IP8. A plurality of output signals OUT1, OUT2 and OUTN may be output from the plurality of output pins OP1, OP2 and OPN, respectively.

The number of the signal input pins IP1, IP2, IP3 and IP4 of the level shifting device 300 according to example embodiments may be less than that of a conventional level shifting device. For example, a conventional 8-channel level shifting device has eight signal input pins. However, the level shifting device 300 according to example embodiments may have only four signal input pins IP1, IP2, IP3 and IP4 even if the level shifting device 300 generates eight output signals OUT1, OUT2 and OUTN. Further, in a case where the level shifting device 300 generates twelve output signals OUT1, OUT2 and OUTN, the number of the signal input pins IP1, IP2, IP3 and IP4 the level shifting device 300 according to example embodiments may be decreased by eight compared with that of a conventional 12-channel level shifting device.

Figure 11:
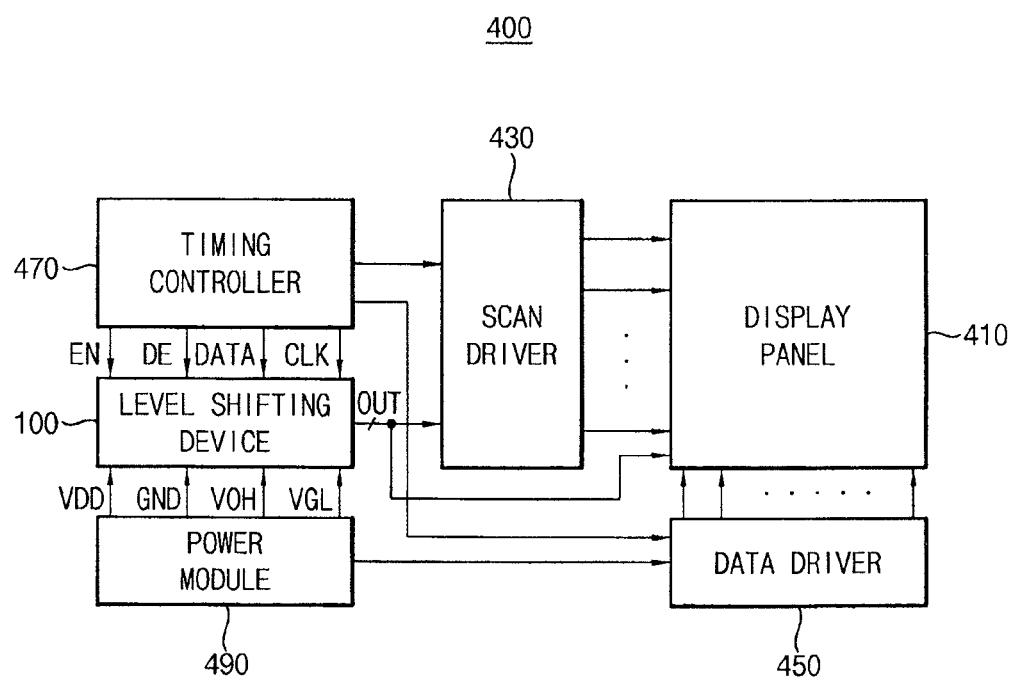
FIG. 11 is a block diagram illustrating a display device including a level shifting device in accordance with example embodiments.

FIG. 11 is a block diagram illustrating a display device including a level shifting device in accordance with example embodiments.

Referring to FIG. 11, a display device 400 includes a display panel 410, a driving unit 430 and 450, a timing controller 470, a power module 490 and a level shifting device 100.

The display panel 410 may include a plurality of pixels that are arranged in a matrix form. For example, the display panel 410 may be a liquid crystal display panel, an organic light emitting display panel, a plasma display panel, etc.

The driving unit 430 and 450 may drive the display panel 410 to display an image. In some example embodiments, the driving unit 430 and 450 may include a scan driver 430 and a data driver 450. The scan driver 430 may be controlled by the timing controller 470 to turn on or off thin film transistors (TFTs) formed on the display panel 410, and the data driver 450 may be controlled by the timing controller 470 to apply a data signal corresponding to an image to be displayed to the display panel 410.

The timing controller 470 may control the driving unit 430 and 450 to display an image by the display panel 410. Further, the timing controller 470 may generate signals EN, DE, DATA and CLK to control the level shifting device 100. For example, the timing controller 470 may generate an enable signal EN, a data enable signal DE, serial input data DATA and a clock signal CLK. The serial input data DATA generated by the timing controller 470 may include a level selection bit and a plurality of output selection signals.

The power module 490 may supply power to the display device 400. Further, the power module 490 may provide voltages VDD, GND, VGH and VGL to the level shifting device 100. For example, the power module 490 may provide the level shifting device 100 with a power supply voltage VDD and a ground voltage VND as internal power supply voltages of the level shifting device 100, and may provide a high gate voltage VGH and a low gate voltage VGL to the level shifting device 100 to generate output signals having voltage levels substantially the same as voltage levels of the high and low gate voltages VGH and VGL.

The level shifting device 100 may receive the enable signal EN, the data enable signal DE, the serial input data DATA and the clock signal CLK from the timing controller 470, and may receive the power supply voltage VDD, the ground voltage VND, the high gate voltage VGH and the low gate voltage VGL from the power module 490. The level shifting device 100 may cause a selected output signal indicated by the plurality of output selection bits included in the serial input data DATA to transition to a voltage level indicated by the level selection bit included in the serial input data DATA. The level shifting device 100 may generate output signals OUT having desired voltage levels, and may provide the output signals OUT having desired voltage levels to the display panel 410 and the driving unit 430 and 450. For example, the output signals OUT generated by the level shifting device 100 may include a clock signal provided to the scan driver 430 and a control signal provided to the display panel 410.

Since the level shifting device 100 receives the serial input data DATA, the level shifting device 100 according to example embodiments may have the reduced number of signal input pins. Further, since the level shifting device 100 generates the plurality of output signals OUT using two level shifters, the level shifting device 100 according to example embodiments may have a small size.

Figure 12:
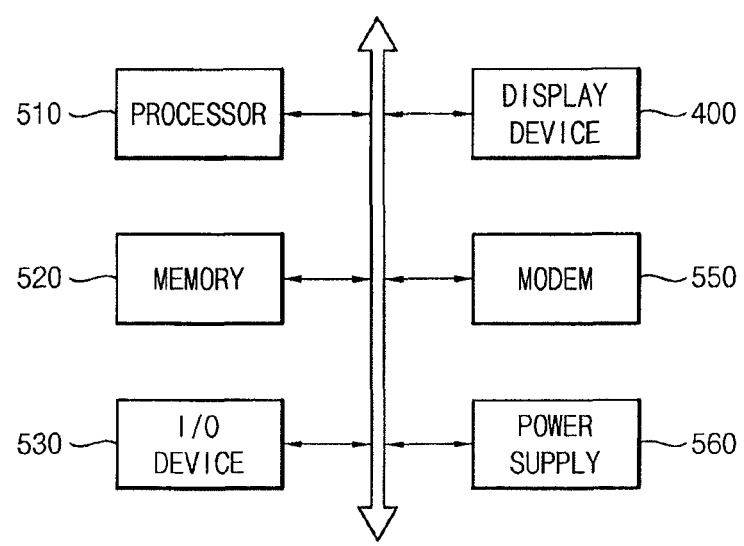
FIG. 12 is a block diagram illustrating a computing system including a display device in accordance with example embodiments.

FIG. 12 is a block diagram illustrating a computing system including a display device in accordance with example embodiments.

Referring to FIG. 12, a computing system 500 includes a processor 510 and a display device 400. In some example embodiments, the computing system 500 may further include a memory device 520, an input/output device 520, a modem 550 and a power supply 560.

The processor 510 may perform specific calculations or tasks. For example, the processor 510 may be a mobile system-on-chip (SOC), an application processor, a media processor, a microprocessor, a central process unit (CPU), a digital signal processor, or the like. The processor 510 may be coupled to the memory device 520 via an address bus, a control bus and/or a data bus. For example, the memory device 520 may be implemented by a dynamic random access memory (DRAM), a mobile DRAM, a static random access memory (SRAM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc. Further, the processor 510 may be coupled to an extension bus, such as a peripheral component interconnect (PCI) bus. The processor 510 may control the input/output device 530 including an input device, such as a keyboard, a mouse, a keypad, etc., and an output device, such as a printer, a display device, etc. via the extension bus. The display device 400 may include a level shifting device having the reduced number of input pins and a small size. Further, the processor 510 may control a storage device, such as a solid state drive, a hard disk drive, a CD-ROM, etc. via the extension bus. The modem 550 may perform wired or wireless communications with an external device. The power supply 560 may supply power to the computing system 500. In some example embodiments, the computing system 500 may further include an application chipset, a camera image processor (CIS), etc.

According to example embodiments, the computing system 500 may be any computing system including the display device 400, such as a digital television (TV), a 3D TV, a personal computer (PC), a home appliance, a laptop computer, a tablet computer, a mobile phone, a smart phone, a personal digital assistant (PDA), a portable multimedia player (PMP), a digital camera, a music player, a portable game console, a navigation device, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A level shifting device, comprising:
    an input unit configured to sample serial input data including a level selection bit and a plurality of output selection bits and to generate a level selection signal and a plurality of output selection signals based on the input data;
    a control unit configured to selectively generate a high level activation signal or a low level activation signal based on the level selection signal, and configured to generate a switching signal based on the plurality of output selection signals;
    a high level generating unit configured to generate a high level output signal in response to a generated high level activation signal;
    a low level generating unit configured to generate a low level output signal in response to a generated low level activation signal; and
    an output unit configured to output one of the high level output signal and the low level output signal on each of a plurality of output signals in response to the switching signal.

2. The level shifting device of claim 1,
    wherein the high level generating unit comprises a high level shifter configured to generate the high level output signal by stepping up a first input signal, and
    wherein the low level generating unit comprises a low level shifter configured to generate the low level output signal by stepping down a second input signal.

3. The level shifting device of claim 2,
    wherein the first input signal is a power supply voltage, and the high level output signal has a voltage level substantially equal to a high gate voltage, and
    wherein the second input signal is a ground voltage, and the low level output signal has a voltage level substantially equal to a low gate voltage.

4. The level shifting device of claim 1,
    wherein the plurality of output selection bits include information indicating a selected output signal among the plurality of output signals, and
    wherein the level selection bit includes information indicating whether the selected output signal transitions to a high level or a low level.

5. The level shifting device of claim 1, wherein the input unit comprises:
    a deserializer configured to generate the level selection signal and the plurality of output selection signals by deserializing the serial input data.

6. The level shifting device of claim 1, wherein the input unit comprises:
    a deserializer configured to generate the level selection signal and a plurality of encoded output selection signals by deserializing the serial input data; and
    a decoder configured to generate the plurality of output selection signals by decoding the plurality of encoded output selection signals.

7. The level shifting device of claim 1, wherein the output unit comprises:
    a switching unit configured to connect one of an output terminal of the high level generating unit and an output terminal of the low level generating unit to each of a plurality of output terminals of the switching unit based on the switching signal; and
    a level maintaining unit comprising a plurality of input terminals connected to the output terminals of the switching unit, and configured to generate a plurality of output voltages based on the high level output signal or the low level output signal of the output terminals of the switching unit.

8. The level shifting device of claim 7, wherein the switching signal includes a plurality of high level selection switching signals and a plurality of low level selection switching signals, and wherein the switching unit comprises:
    a plurality of first switching elements configured to selectively connect the output terminal of the high level generating unit to the plurality of input terminals of the level maintaining unit in response to the plurality of high level selection switching signals; and
    a plurality of second switching elements configured to selectively connect the output terminal of the low level generating unit to the plurality of input terminals of the level maintaining unit in response to the plurality of low level selection switching signals.

9. The level shifting device of claim 8, wherein the switching unit further comprises:
    a plurality of third switching elements configured to selectively connect the output terminal of the high level generating unit to a plurality of output terminals of the level maintaining unit in response to the plurality of high level selection switching signals; and
    a plurality of fourth switching elements configured to selectively connect the output terminal of the low level generating unit to the plurality of output terminals of the level maintaining unit in response to the plurality of low level selection switching signals.

10. The level shifting device of claim 7, wherein the level maintaining unit comprises:
a plurality of latches configured to maintain voltage levels of the plurality of output signals.

11. A display device, comprising:
a display panel including a plurality of pixels;
a driving unit configured to drive the display panel to display an image;
a timing controller configured to control the driving unit, and configured to generate serial input data including a level selection bit and a plurality of output selection bits; and
a level shifting device configured to generate a plurality of output signals having predetermined voltage levels based on the serial input data, and configured to provide the plurality of output signals to the display panel and the driving unit, the level shifting device comprising:
an input unit configured to sample the serial input data including the level selection bit and the plurality of output selection bits and to generate a level selection signal and a plurality of output selection signals based on the input data;
a control unit configured to selectively generate a high level activation signal or a low level activation signal based on the level selection signal, and configured to generate a switching signal based on the plurality of output selection signals;
a high level generating unit configured to generate a high level output signal in response to a generated high level activation signal;
a low level generating unit configured to generate a low level output signal in response to a generated low level activation signal; and
an output unit configured to output one of the high level output signal and the low level output signal on each of a plurality of output signals in response to the switching signal.

12. The display device of claim 11,
wherein the high level generating unit comprises a high level shifter configured to generate the high level output signal by stepping up a first input signal, and
wherein the low level generating unit comprises a low level shifter configured to generate the low level output signal by stepping down a second input signal.

13. The display device of claim 12,
wherein the first input signal is a power supply voltage of the level shifting device, and the high level output signal has a voltage level substantially equal to a high gate voltage, and
wherein the second input signal is a ground voltage of the level shifting device, and the low level output signal has a voltage level substantially equal to a low gate voltage.

14. The display device of claim 11,
wherein the plurality of output selection bits include information indicating a selected output signal among the plurality of output signals, and
wherein the level selection bit includes information indicating whether the selected output signal transitions to a high level or a low level.

15. The display device of claim 11, wherein the input unit comprises:
a deserializer configured to generate the level selection signal and the plurality of output selection signals by deserializing the serial input data.

16. The display device of claim 11, wherein the input unit comprises:
a deserializer configured to generate the level selection signal and a plurality of encoded output selection signals by deserializing the serial input data; and
a decoder configured to generate the plurality of output selection signals by decoding the plurality of encoded output selection signals.

17. The display device of claim 11, wherein the output unit comprises:
a switching unit configured to connect one of an output terminal of the high level generating unit and an output terminal of the low level generating unit to each of a plurality of output terminals of the switching unit based on the switching signal; and
a level maintaining unit comprising a plurality of input terminals connected to the output terminals of the switching unit, and configured to generate a plurality of output voltages based on the high level output signal or the low level output signal of the output terminals of the switching unit.

18. The display device of claim 17, wherein the switching signal includes a plurality of high level selection switching signals and a plurality of low level selection switching signals, and wherein the switching unit comprises:
a plurality of first switching elements configured to selectively connect the output terminal of the high level generating unit to the plurality of input terminals of the level maintaining unit in response to the plurality of high level selection switching signals; and
a plurality of second switching elements configured to selectively connect the output terminal of the low level generating unit to the plurality of input terminals of the level maintaining unit in response to the plurality of low level selection switching signals.

19. The display device of claim 18, wherein the switching unit further comprises:
a plurality of third switching elements configured to selectively connect the output terminal of the high level generating unit to a plurality of output terminals of the level maintaining unit in response to the plurality of high level selection switching signals; and
a plurality of fourth switching elements configured to selectively connect the output terminal of the low level generating unit to the plurality of output terminals of the level maintaining unit in response to the plurality of low level selection switching signals.

20. The display device of claim 17, wherein the level maintaining unit comprises:
a plurality of latches configured to maintain voltage levels of the plurality of output signals.

* * * * *